(12) United States Patent
Cho

(10) Patent No.: US 6,747,864 B2
(45) Date of Patent: Jun. 8, 2004

(54) DISTRIBUTION BOARD WITH UNINTERRUPTIBLE SOCKET TERMINAL BLOCK

(76) Inventor: Keun-Suk Cho, 431-103 Jugong Apt. 189 Gaepo-dong, Gangnam-gu, Seoul (KR)

( * ) Notice: Subject to any disclaimer, the term of this patent is extended or adjusted under 35 U.S.C. 154(b) by 0 days.

(21) Appl. No.: 10/364,366

(22) Filed: Feb. 12, 2003

(65) Prior Publication Data

US 2003/0161092 A1 Aug. 28, 2003

(30) Foreign Application Priority Data

Feb. 27, 2002 (KR) ................................ 10-2002-0010531

(51) Int. Cl.$^7$ ................................................. H02B 1/00
(52) U.S. Cl. ........................ 361/668; 361/627; 361/823; 439/188
(58) Field of Search ................................ 361/600, 668, 361/669, 627, 823; 439/517, 507

(56) References Cited

U.S. PATENT DOCUMENTS

| | | | | |
|---|---|---|---|---|
| 5,627,724 A | * | 5/1997 | Leach et al. | 361/663 |
| 5,657,200 A | * | 8/1997 | Leach et al. | 361/668 |
| 5,775,942 A | * | 7/1998 | Jeffcoat | 439/517 |
| 6,150,734 A | * | 11/2000 | Neibecker et al. | 307/10.1 |
| 6,402,566 B1 | * | 6/2002 | Middlehurst et al. | 439/699.1 |
| 6,498,717 B2 | * | 12/2002 | Matthews | 361/665 |
| 6,561,844 B1 | * | 5/2003 | Johnson | 439/507 |

* cited by examiner

*Primary Examiner*—Boris Chervinsky
(74) *Attorney, Agent, or Firm*—Jacobson Holman PLLC

(57) ABSTRACT

A distribution board enabling a watt-hour meter mounted thereon to be easily replaced without interrupting the supply of primary electric power to a consumer's house is disclosed. The distribution board includes a socket terminal block having a plurality of socket terminal connectors, each having a pair of wire-connector terminals and a plug-connector terminal extending from the conjunction portion between the pair of wire-connector terminals, and a power-converting plug having a plurality of plug terminals to be connected to the plug-connector terminals of the socket terminal connectors and connected to each other by plug-connecting wires. Primary electric power from drop wires is directly transmitted to indoor power wires when the power-converting plug is coupled to the socket terminal block to cause the plug terminals to be connected to the plug-connector terminals.

6 Claims, 5 Drawing Sheets

DISTRIBUTION BOARD WITH UNINTERRUPTIBLE SOCKET TERMINAL BLOCK

BACKGROUND OF THE INVENTION

1. Field of the Invention

The present invention relates to a distribution board equipped with an uninterruptible socket terminal block, which enables a watt-hour meter to be replaced without interrupting the supply of indoor power, and more particularly to a distribution board equipped with an uninterruptible socket terminal block, which enables a watt-hour meter equipped thereon to be easily replaced, and enables drop wires and indoor power wires to be easily separated from and connected to the watt-hour meter by using an associated power-converting plugs, without necessity of interrupting supply of indoor power, without regard to the confined space of the distribution board and the standard of terminals applied in the watt-hour meter.

2. Description of the Prior Art

In general, electric power, necessary for all household consumers, is introduced to an indoor distribution board from drop wires of an electric pole connected to an electric power company's distribution lines through an indoor watt-hour meter. An installation of drop wires between the electric pole and a consumer's watt-hour meter in the distribution board is usually the responsibility of the electric power company, while a wiring operation of indoor electric wires leading out of the watt-hour meter is the responsibility of a consumer and is carried out by a usual electrical contractor.

The watt-hour meter for measuring the quantity of electric energy consumed by the consumer is installed by the electric power company. After about seven years of use, the used watt-hour meter mounted on the distribution board is replaced by the electric power company with a new one. At this point, the electric power supplied to the consumer's house must be interrupted in order to replace the used watt-hour meter.

For the replacing operation of the used watt-hour meter, the drop wires, for conducting primary electrical power to the watt-hour meter, and the indoor power wires, for drawing secondary electrical power out of the watt-hour meter, must be separated from the watt-hour meter and again connected thereto. In this operation, an electrician has to perform procedures of separating the drop wires and the indoor power wires from terminals of a terminal block, stripping coverings from both ends of the drop wires and the indoor power wires to expose conducting core wires thereof, and again connecting the exposed intermediate wires to the corresponding terminals of the terminal block. However, safety hazards due to handling of electric wires and inconvenience due to interruption of supply of indoor electric power inevitably accompany such operation.

SUMMARY OF THE INVENTION

Accordingly, the present invention has been made keeping in mind the above problems occurring in the prior art, and an object of the present invention is to provide a distribution board equipped with an uninterruptible socket terminal block, which enables a watt-hour meter equipped thereon to be easily replaced and enables drop wires and indoor power wires to be easily separated from and connected to the watt-hour meter by using its associated power-converting plug, without necessity of interrupting the supply of primary electric power to the consumer's house, without regard to the confined space of the distribution board or the standard of terminals applied in the watt-hour meter.

In order to accomplish the above object, the present invention provides a distribution board comprising: an uninterruptible socket terminal block including a plurality of socket terminal connectors, each of socket terminal connectors having a pair of wire-connector terminals extending in directions opposite each other and a plug-connector terminal extending from the conjunction portion between the pair of wire-connector terminals in a direction perpendicular to the pair of wire-connector terminals, the wire-connectors, which extend in one direction, being connected to drop wires for conducting primary electric power and indoor power wires for conducting secondary electric power, and the other wire-connectors, which extend in the other direction, being connected to intermediate wires for connecting the drop wires and the indoor power wires to terminals of a watt-hour meter; and a power-converting plug including a plurality of plug terminals to be connected to the corresponding plug-connector terminals of the socket terminal connectors, half of the plurality of plug terminals being connected to the other half of the plurality of plug terminals via plug-connecting wires; whereby primary electric power from the drop wires is directly transmitted to the indoor power wires when the power-converting plug is coupled to the socket terminal block to cause the plug terminals of the power-converting plug to be connected to the corresponding plug-connector terminals of the socket terminal connectors.

The socket terminal block may be made from an insulating material.

The socket terminal block may be provided at the central line thereof with plug-inserting holes to receive the corresponding plug terminals and the corresponding plug-connector terminals, and may be provided at both side surfaces thereof with wire-inserting holes to receive the corresponding wire-connector terminals.

The wire-connector terminals of the socket terminal connectors may include threaded holes into which screws are tightened to hold the wires inserted into the wire-connector terminals, and each pair of wire-connector terminals are provided at the conjunction portion thereof with a plug-positioning groove that the plug-connector terminal is placed thereinto and fixed thereto.

The distribution board may include a wire-retainer provided at covering portions of the intermediate wires connected to the drop wires and the indoor power wires, in order to hold the wires without displacement of the wires.

The distribution board may include a wire-adjusting unit, which comprises upper and lower housings provided with a plurality of recesses at facing surfaces thereof and adapted to be tightened to each other by fastening means, and a plurality of pairs of plug terminals disposed between the corresponding recesses of the upper and lower housings and extending toward both the socket terminal block and the watt-hour meter, whereby each pair of plug terminals are properly fixed at desired positions between the upper and lower housings according to a distance defined between the watt-hour meter and the socket terminal block.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

This invention will be described in further detail by way of example with reference to the accompanying drawings.

Figure 1:
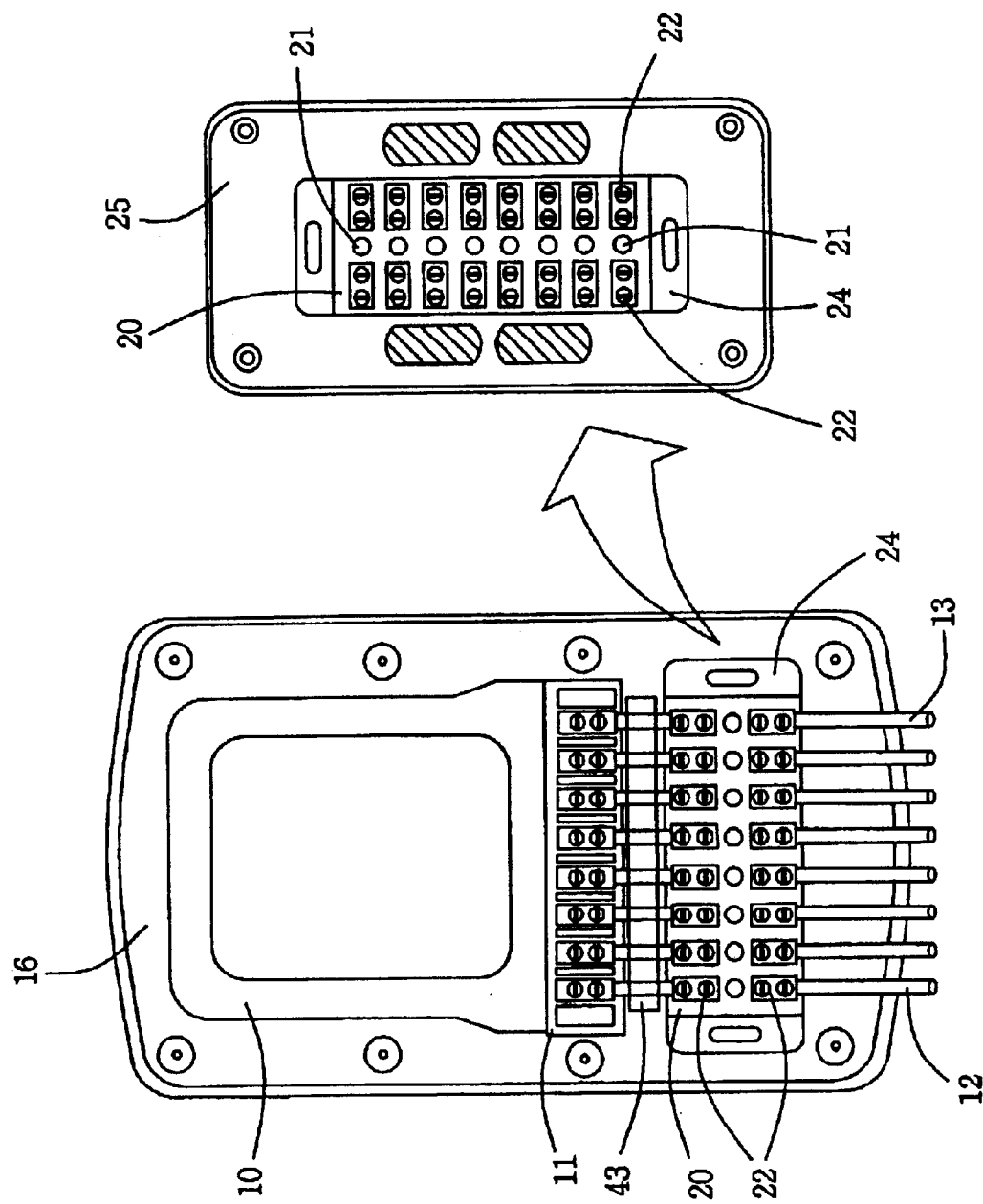
FIG. 1 is a plan view of a distribution board equipped with an uninterruptible socket terminal block according to the present invention.
Figure 2:
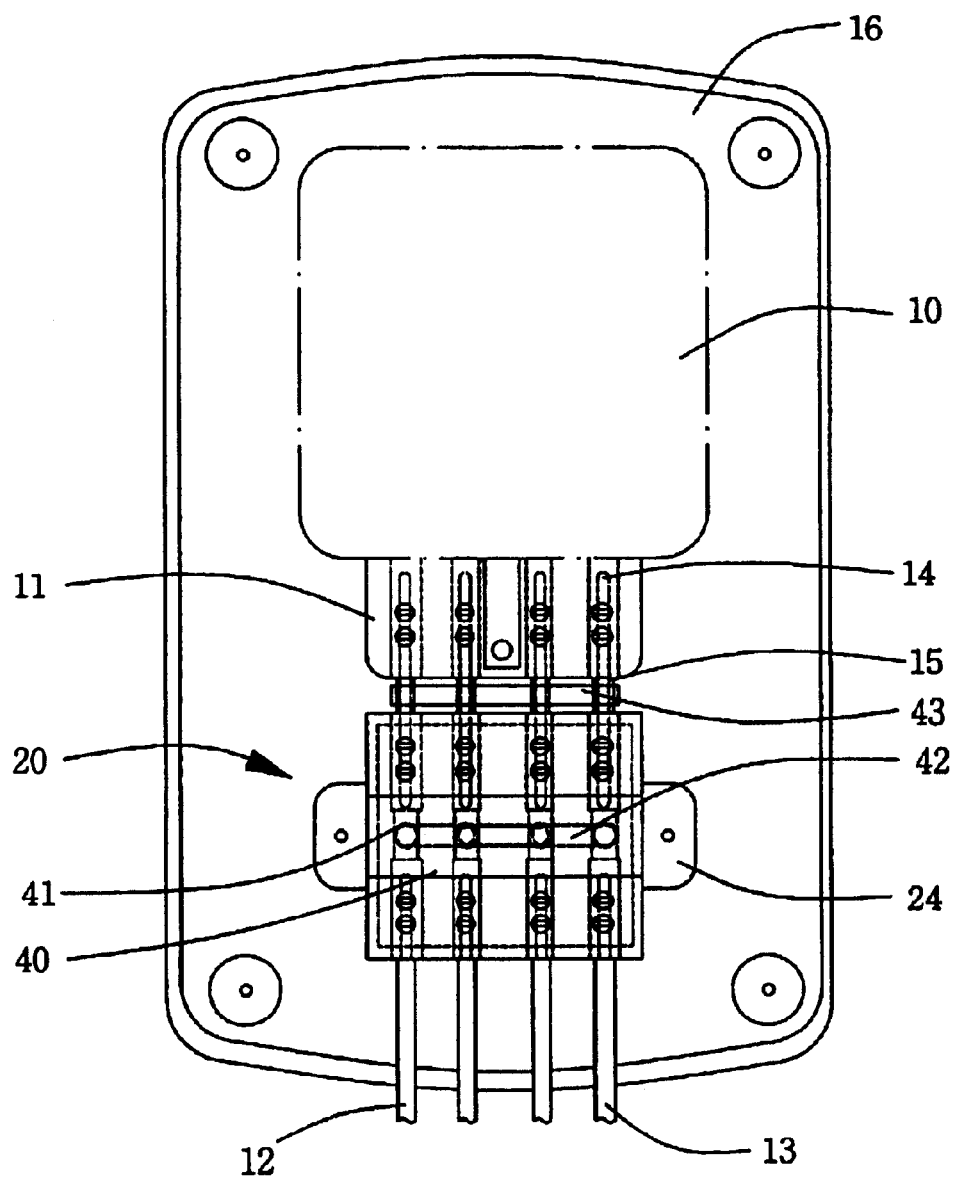
FIG. 2 is a plan view of a distribution board equipped with an uninterruptible socket terminal block according to the present invention in which a power-converting plug is coupled to a socket terminal block.

FIG. 1 shows a distribution board according to the present invention, in which terminals of an uninterruptible socket terminal block 20 are connected to terminals of a meter terminal block 11 of a watt-hour meter 10, and FIG. 2 shows a distribution board according to the present invention, in which an additional power-converting plug 40 is connected to the socket terminal block 20, so as to replace the watt-hour meter 10 without interruption of the supply of primary electric power from a drop wire to an indoor power wire 13.

Figure 3:
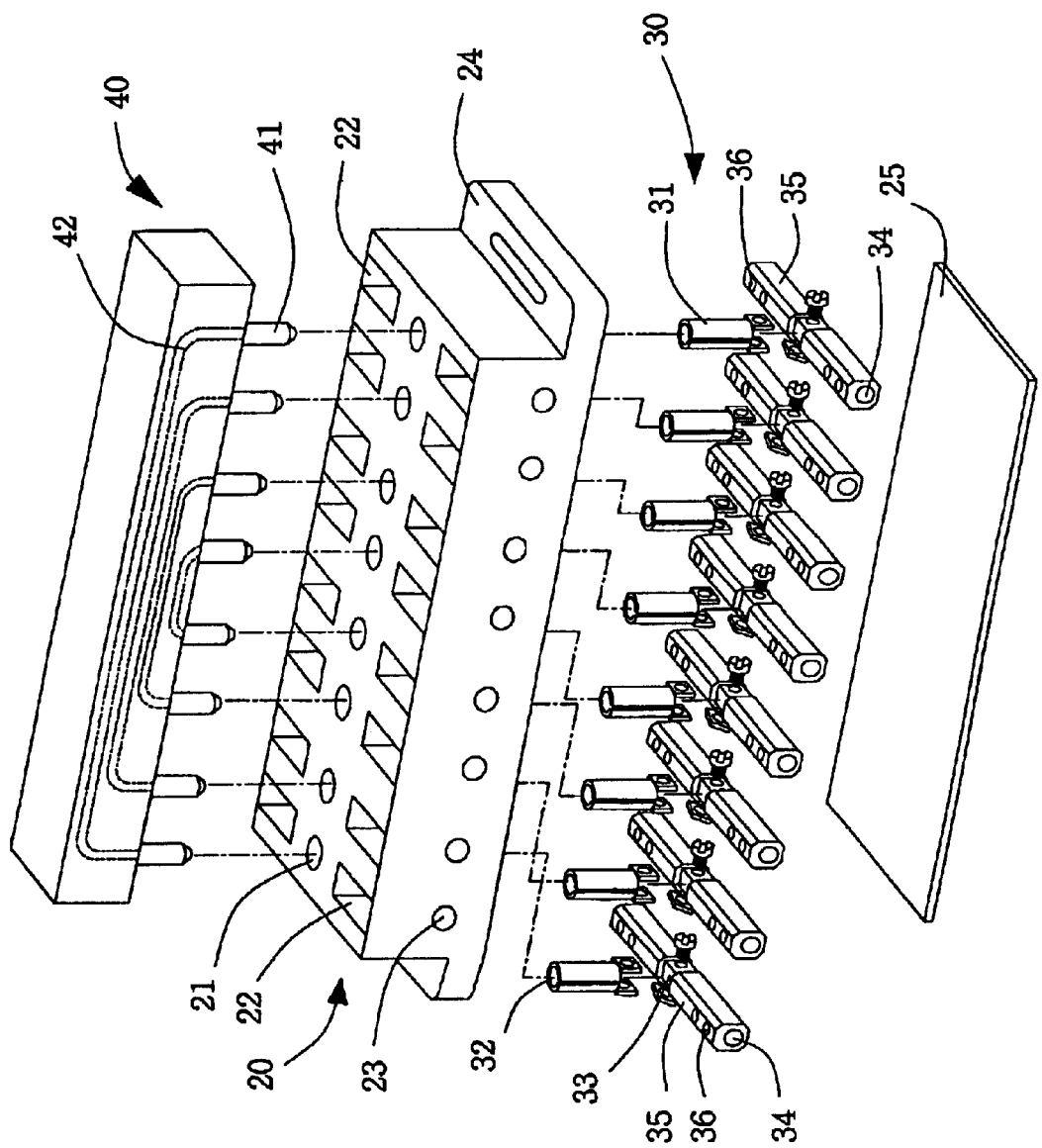
FIG. 3 is an exploded perspective view of the socket terminal block provided at the distribution board according to present invention.
Figure 4:
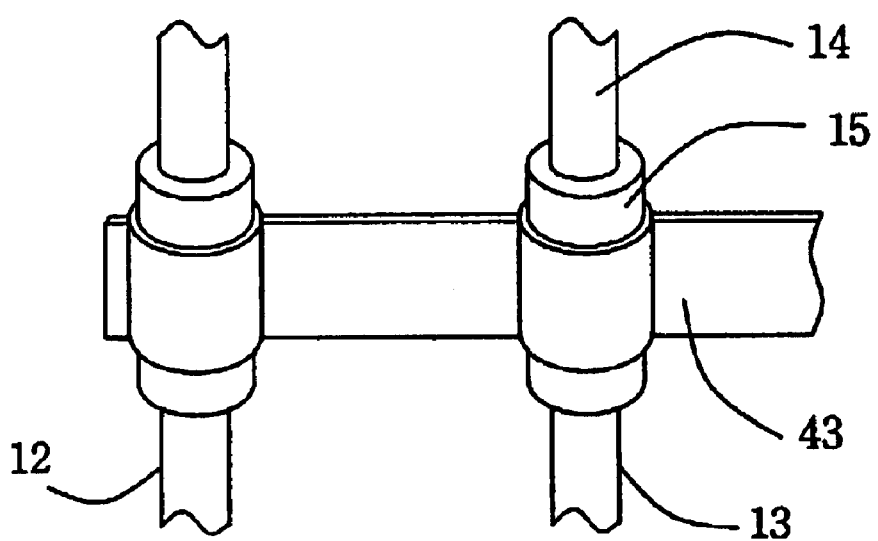
FIG. 4 is a perspective view of a wire-retainer according to the present invention, which holds wires connected to a watt-hour meter.

FIG. 3 is an exploded perspective view showing a coupling structure of the socket terminal block 20 and the power-converting plug 40 according to the present invention, and FIG. 4 shows a wire-retainer 43 adapted to hold an intermediate wire 14 connected to the meter terminal block 11 of the watt-hour meter 10 to prevent displacement of the electric wire, according to the present invention.

As shown in the drawings, the distribution board according to the present invention is intended to allow the watt-hour meter 10 to be replaced without disconnecting the indoor power wires 13. The primary drop wires 12 for conducting primary electric power and the intermediate wires 14 for conducting secondary electric power are inserted into wire-inserting holes 34 of wire-connector terminals 35 of a socket terminal connector unit 30 embedded in the socket terminal block 20, and then connected thereto by screws passing through threaded holes 36 formed at the wire-connector terminals 35. Terminals of the meter terminal block 11 are connected to the wire-connector terminals 35 from the direction of the watt-hour meter 10, in the same connecting manner.

To allow the drop wires 12 to be directly connected to the indoor power wires 13 at the time of replacement of the watt-hour meter 10, the socket terminal block 20 is provided with the power-converting plug 40, such that plug terminals 41 of the power-converting plug 40 are connected to corresponding plug-connector terminals 31 of the socket terminal block 20. The plug terminals 41 for the drop wires 12 are connected to the corresponding plug terminals 41 for the indoor power wires 13 by plug-connecting wires 42.

The socket terminal block 20, which is made from an insulation material, is provided along the central line thereof with vertical plug-inserting holes 21 into which the plug terminals 41 of the power-converting plug 40 are inserted. The socket terminal block 20 is further provided at its upper surface with screw recesses 22 to be positioned at both sides of the plug-inserting holes 21, and is provided at its front and rear side surfaces with horizontal wire-inserting holes 23. The socket terminal block 20 also includes block-mounting wings 24 at both its sides.

The socket terminal connector unit 30 embedded in the socket terminal block 20 includes the vertical plug-connector terminals 31 along the central line thereof, into which the plug terminals 41 of the power-converting plug 40 are inserted, and the horizontal wire-connector terminals 35 extending from the corresponding plug-connector terminals 31 forward and backward, into which the exposed core wires of the drop wire 12, the indoor power wire 13 and the intermediate wires 14 are inserted.

The horizontal wire-connector terminals 35, which extend from the plug-connector terminals 31 forward and backward, are provided with threaded holes 36, so as to fix the wires 12, 13 and 14 thereto via screws passing through the threaded holes 36. Each of the wire-connector terminals 35 is provided at its center portion with a plug-positioning groove 33, so that the plug-connector terminal 31 is placed in the plug-positioning groove 33 and joined thereto by screws.

Furthermore, the distribution according to the present invention may be additionally provided with a wire-retainer 43, which surrounds the unexposed covering portions of the intermediate wires 14.

According to the present invention, the drop wires 12 and the indoor power wires 13 are connected to the terminals of the meter terminal block 11 positioned under the watt-hour meter 10 mounted on the distribution board 16, via the socket terminal block 20. Although the socket terminal block 20 is preferably positioned below the watt-hour meter 10, so as to allow the watt-hour meter 10 to be easily replaced regardless of the confined space of the distribution board 16 or the standard of the terminals applied in the watt-hour meter 10, the socket terminal block 20 may be installed outside the distribution board 16 if necessary.

As shown in FIG. 4, the distribution board 16 according to the present invention may be provided with the wire-retainer 43 so as to cause the intermediate wires 14 of the drop wires 12 and the indoor power wires 13 to be firmly connected to the terminals of the meter terminal block 11 of the watt-hour meter 10. Therefore, since the wire-retainer 43 firmly holds covering portions 15 of the intermediate wires 14, the intermediate wires 14 can be uniformly arranged and stably maintained between the socket terminal block 20 and the meter terminal block 11.

Figure 5:
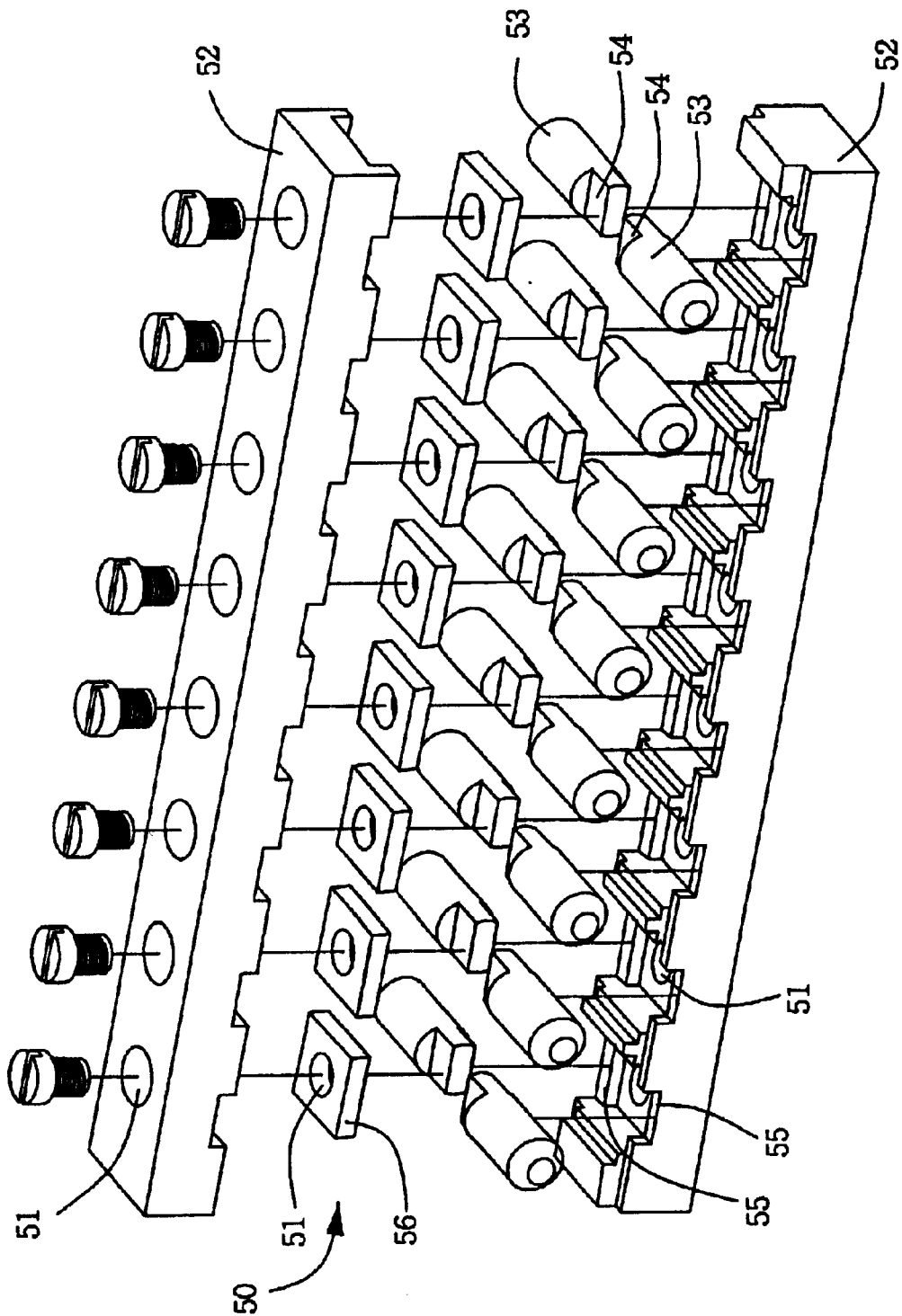
FIG. 5 is an exploded perspective view of a wire-adjusting unit according to the present invention, which allows lengths of intermediate wires to be adjusted according to a distance between the watt-hour meter and the socket terminal block.

Referring to FIG. 5, there is shown a wire-adjusting unit 50 which may be used in place of the wire-retainer 43 in order to adjust lengths of the intermediate wires 14 when there are differences between the lengths of the intermediate wires 14 between the meter terminal block 11 of the watt-hour meter 10 and the socket terminal block 20. The wire-adjusting unit 50 includes a pair of upper and lower housings 52, each of which has a plurality of front terminal recesses 55 and a plurality of rear terminal recesses 55. A plurality of pairs of plug terminals 53, each having a stepped portion 54, are disposed on the front and rear terminal recesses 55 of the lower housings 52, such that the rear plug terminals 53 to be connected to the terminals of the meter terminal block 11 are positioned according to the size of the meter terminal block 11. Thereafter, connecting pieces 56, each having a through hole 51, are placed upon the stepped portions 54 of the front and rear plug terminals 53, and the upper housing 52 is placed upon the lower housing 52 with the plug terminals 53 and the connecting pieces 56 thereon. Subsequently, the upper and lower housings 52 are tightened to each other by bolts passing through the through holes 51.

According to the distribution board equipped with an uninterruptible socket terminal block, which is constructed as described above, the drop wires 12 and the indoor power wires 13 can be stably connected to the terminals of the meter terminal block 11 of the watt-hour meter 10 via the socket terminal block 20. More specifically, stripped wires of the drop wires 12 and the indoor power wires 13 are inserted into the wire-inserting holes 34 of the wire-connector terminals 35 of the socket terminal connector unit 30 embedded in the socket terminal block 20, and then firmly fixed thereto by tightening screws through the threaded holes 36. Thereafter, the intermediate wires 14 are also connected between the terminals of the socket terminal block 20 and the terminals of the meter terminal block 11, in the same manner as the drop wires 12 and the indoor power wires 13.

When the watt-hour meter 10 is replaced with a new one, the plug terminals 41 of the power-converting plug 40 are first inserted into the plug-inserting holes 21 of the socket terminal block 20, as shown in FIGS. 2 and 3. Consequently, electrical power supplied from the drop wires 12 is not only transmitted to the terminals of the meter terminal block 11 of the watt-hour meter 10 through the wire-connector terminals 35 of the socket terminal block 20, but also transmitted to the indoor power wires 13 through the plug terminals 41 of the power-converting plug 40.

Therefore, the watt-hour meter 10 can be easily replaced by joining the power-converting plug 40 to the socket terminal block 20, without interruption of the supply of electric power. In this case, the power-converting plug 40 must be prepared to meet the standard applied to the socket terminal block 20.

Where the standard of the terminals of the watt-hour meter 10 is different from that of the socket terminal block 20, the intermediate wires 14 can be connected between the watt-hour meter 10 and the socket terminal block 20 via the wire-adjusting unit 50, as shown in FIG. 5. This is simply achieved by adjusting positions of the plug terminals 53 provided at any one of both sides of the wire-adjusting unit 50.

As described above, the present invention provides a distribution board equipped with an uninterruptible socket terminal block, which allows a watt-hour meter to be easily replaced without interrupting the supply of primary electric power from a drop wire to an indoor power wire. Therefore, the distribution board according to the present invention can solve various problems, i.e., inconvenience due to interruption of the supply of electric power to a consumer's house, consumer's complaints regarding the interruption of the supply of electric power, several visitations and operations for adapting a new watt-hour meter having a different standard to a current distribution board, and increase of cost due to the above problems.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A distribution board comprising:

an uninterruptible socket terminal block including a plurality of socket terminal connectors, each of socket terminal connectors having a pair of wire-connector terminals extending in directions opposite each other and a plug-connector terminal extending from the conjunction portion between the pair of wire-connector terminals in a direction perpendicular to the pair of wire-connector terminals, the wire-connectors, which extend in one direction, being connected to drop wires for conducting primary electric power and indoor power wires for conducting secondary electric power, and the other wire-connectors, which extend in the other direction, being connected to intermediate wires for connecting the drop wires and the indoor power wires to terminals of a watt-hour meter; and a power-converting plug including a plurality of plug terminals to be connected to the corresponding plug-connector terminals of the socket terminal connectors, half of the plurality of plug terminals being connected to the other half of the plurality of plug terminals via plug-connecting wires;

whereby primary electric power from the drop wires is directly transmitted to the indoor power wires when the power-converting plug is coupled to the socket terminal block to cause the plug terminals of the power-converting plug to be connected to the corresponding plug-connector terminals of the socket terminal connectors.

2. The distribution board as set forth in claim 1, wherein the socket terminal block is made from an insulating material, and the socket terminal block is provided at the central line thereof with plug-inserting holes to receive the corresponding plug terminals and the corresponding plug-connector terminals, and is provided at both side surfaces thereof with wire-inserting holes to receive the corresponding wire-connector terminals.

3. The distribution board as set forth in claim 1, wherein the wire-connector terminals of the socket terminal connectors include threaded holes into which screws are tightened to hold the wires inserted into the wire-connector terminals, and each pair of wire-connector terminals are provided at the conjunction portion thereof with a plug-positioning groove that the plug-connector terminal is placed thereinto and fixed therein.

4. The distribution board as set forth in claim 1, further comprising a wire-retainer provided at covering portions of the intermediate wires connected to the drop wires and the indoor power wires, in order to hold the wires without displacement of the wires.

5. The distribution board as set forth in claim 1, further comprising a wire-adjusting unit, which comprises upper and lower housings provided with a plurality of recesses at facing surfaces thereof and adapted to be tightened to each other by fastening means, and a plurality of pairs of plug terminals disposed between the corresponding recesses of the upper and lower housings and extending toward both the socket terminal block and the watt-hour meter, whereby each pair of plug terminals are properly fixed at desired positions between the upper and lower housings according to a distance defined between the watt-hour meter and the socket terminal block.

6. The distribution board as set forth in claim 2, wherein the wire-connector terminals of the socket terminal connectors include threaded holes into which screws are tightened to hold the wires inserted into the wire-connector terminals, and each pair of wire-connector terminals are provided at the conjunction portion thereof with a plug-positioning groove that the plug-connector terminal is placed thereinto and fixed therein.

* * * * *